(12) United States Patent
Wieczorek et al.

(10) Patent No.: US 6,255,182 B1
(45) Date of Patent: Jul. 3, 2001

(54) METHOD OF FORMING A GATE STRUCTURE OF A TRANSISTOR BY MEANS OF SCALABLE SPACER TECHNOLOGY

(75) Inventors: Karsten Wieczorek, Reichenberg-Boxdorf; Manfred Horstmann, Dresden, both of (DE); Frederick N. Hause, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/503,634

(22) Filed: Feb. 14, 2000

(51) Int. Cl.⁷ .................................................. H01L 21/336
(52) U.S. Cl. .......................... 438/305; 438/306; 438/585; 438/595
(58) Field of Search .................................... 438/585, 595, 438/197, 303, 305, 306

(56) References Cited

U.S. PATENT DOCUMENTS

| | | | |
|---|---|---|---|
| 5,918,132 | * | 6/1999 | Qian et al. ............................ 438/299 |
| 5,923,981 | * | 7/1999 | Qian ..................................... 438/284 |
| 6,022,815 | * | 2/2000 | Doyle et al. .......................... 438/947 |
| 6,103,605 | * | 8/2000 | Hopper ................................. 438/585 |

* cited by examiner

Primary Examiner—Long Pham
(74) Attorney, Agent, or Firm—Williams, Morgan & Amerson, P.C.

(57) ABSTRACT

A method is described which can be used to form gate structures of very small dimensions in a semiconductor device. The method may be used to avoid employment of highly-sophisticated and cost-intensive DUV photolithography. In one illustrative embodiment, the method comprises forming a gate electrode layer, forming a first mask layer above the gate electrode layer, and forming a sidewall spacer adjacent the sidewalls of the first mask layer. Thereafter, the method comprises forming a second mask layer above a portion of the sidewall spacer and the first mask layer, removing portions of the sidewall spacer to define a hard mask comprised of a portion of the sidewall spacer, and patterning the gate electrode layer using the hard mask to define a gate electrode of the device.

17 Claims, 5 Drawing Sheets

METHOD OF FORMING A GATE STRUCTURE OF A TRANSISTOR BY MEANS OF SCALABLE SPACER TECHNOLOGY

BACKGROUND OF THE INVENTION

1. Field of the Invention

The present invention relates to fabrication of integrated circuit devices and, more particularly, to a method of forming a gate structure on a semiconductor device, such as a field effect transistor.

2. Description of the Related Art

The manufacturing process of integrated circuits involves the fabrication of numerous insulated gate field effect transistors, such as metal oxide semiconductor field effect transistors (MOSFET). In order to ever increase integration density and improve device performance, for instance with respect to signal processing time and power consumption, feature sizes of the transistor structures are steadily decreasing. Accordingly, there is a demand for ever-improved, efficient, reliable and inexpensive methods for patterning the various process layers or films in an integrated circuit device so as to be suitable for the needs of mass production. Optical photolithography is generally used as the standard method for feature definition in semiconductor manufacturing operations. This process generally provides the desired high throughput. With currently available photolithography steppers, using high NA (numerical aperture) lenses and deep UV (ultraviolet) exposure light and a subsequent etch-trim process, it is, for instance, possible to reliably pattern feature sizes as small as 0.2 $\mu$m.

As will be understood by those skilled in the art, the formation of a gate electrode of a semiconductor device is a critical step in the manufacturing process of the device. The gate length dimension, i.e., the lateral extension of the gate electrode between the source and the drain electrode of a transistor, is desirably reduced to sizes approaching or even exceeding the resolution limit of the optical imaging systems used for patterning the device features. In a field effect transistor, such as a MOSFET, the gate electrode is used to create and control an underlying channel which forms near the surface of the semiconductor substrate between a source region and a drain region once the voltage supplied to the gate electrode exceeds the threshold voltage of the transistor.

The source and the drain regions are formed in, on or over the semiconductor substrate, which is doped inversely to the drain and source regions. The gate electrode is separated from the channel and the source and drain regions by a thin insulating, gate dielectric layer, that is generally comprised of an oxide layer or a nitride layer. During operation, a voltage is supplied to the gate electrode in order to create an electric field which, in turn, generates an inversion layer near the surface of the substrate below the thin insulating, gate dielectric layer. The electric field controls the conductivity as well as the depth of the inversion layer which provides for an electrical connection between the source and drain. Thus, it is desirable to have a thin gate dielectric layer to enhance the electric field for rapidly building up a deep inversion layer to attain improved signal performance of the transistor device. In this respect, it is also desirable to have as short a channel length as possible to further reduce the resistance of the transistor, and increase the overall operating speed of the device.

An illustrative example of forming a gate electrode according to a typical prior art process will be described with reference to FIGS. 1A–1C which show schematic cross-sectional views of various stages in the formation of the gate structure of a typical prior art device. As the skilled person will readily appreciate, these figures are merely of an illustrative nature and are provided only to facilitate the explanation of various process steps. Accordingly, the relation between various feature sizes may not necessarily reflect the real situation. In addition, in reality, boundaries between specific portions of the device and between various layers may not be as sharp and precise as illustrated in these figures.

FIG. 1A shows a schematic cross-sectional view in which shallow trench isolations 2 comprised of silicon dioxide are formed in a silicon substrate 1. Between the shallow trench isolations 2, which define an active region 20 of the transistor device to be formed, a thin gate oxide layer 3 has been grown. Subsequently, a gate electrode material layer 4 consisting of, for example, polycrystalline silicon, has been deposited over the structure. The gate electrode layer 4 is covered by an anti-reflective coating (ARC) layer 5. The ARC layer 5 is used to perform an advanced DUV-photolithography step in order to produce a gate electrode resist mask 6 over the gate electrode layer 4. Creating the gate electrode resist mask 6 using DUV photolithography techniques, as well as a critical etch trim process used to form the resist mask 6, is cost-intensive and may also lead to large variations in the gate lengths and thus large variations in performance of the resulting semiconductor device may result.

FIG. 1B depicts a schematic view of the device as shown in FIG. 1A after a portion of the ARC layer 5 and a portion of the gate electrode layer 4 have been removed by anisotropic etching, wherein the resist mask 6 serves as an etch mask to form a gate electrode 4A.

FIG. 1C schematically shows the finally-completed device, wherein the following steps have been performed. The resist mask 6, shown in FIG. 1B, has been stripped off and the ARC layer 5 has been removed by one or more wet chemical etching processes. Subsequently, lightly doped regions are formed in the substrate 1, and a plurality of sidewall spacers 7 serve as an implantation mask for the subsequent implantation step for the formation of a drain and a source region 8. Then, a rapid thermal annealing process is performed to activate the drain and source regions 8, and a silicide processing operation is performed to produce drain and source electrodes 9.

As discussed above, the length of the gate electrode 4A is defined by the resist mask 6, which is formed by a DUV photolithographic step, and the subsequent etching of the gate electrode layer 4. If the gate length dimension is reduced to less than a size which can be reliably patterned by conventional photolithography techniques, the use of highly-sophisticated DUV technology, which is cost-intensive, and the necessary etch-trim process, leads to variations in the gate lengths of devices fabricated on different substrate wafers or at different locations within a single wafer, or to variations in the gate length along a gate width direction, which is defined by the extension of the transistor in the direction perpendicular to the drawing plane of FIGS. 1A–1C. These variations, in turn, result in strongly varying drive currents and, accordingly, in strongly varying electrical characteristics of the transistors.

Therefore, as the dimensions of the gate electrode 4A significantly influence the electrical characteristics of the transistor, it is important to provide a method of reliably and reproducibly patterning gate electrodes 4A so as to minimize variations in the electrical characteristics of integrated circuits. Formation of gate electrodes beyond the sub-quarter micron range, to the extent to which this is even possible, conventionally requires especially costly and complex patterning processes using the most up-to-date patterning tools such as the aforementioned deep ultraviolet (DUV) photolithography steppers.

In view of the above-described problems, a need exists for a method of patterning gate electrodes of field effect transistors in integrated circuits to a size smaller than the resolution limit of currently available photolithography tools.

The present invention is directed to a method of making a semiconductor device that solves, or at least reduces, some or all of the aforementioned problems.

SUMMARY OF THE INVENTION

In general, the present invention provides a method of forming a gate structure of a field effect transistor, wherein the gate length of the gate electrode is not limited by the limitations of traditional photolithographic techniques. In one illustrative embodiment, the method disclosed herein is comprised of forming a gate electrode layer above a semiconducting substrate, forming a first mask layer above the gate electrode layer, and forming a sidewall spacer adjacent the sidewalls of the first mask layer. The method further comprises forming a second mask layer above a portion of the sidewall spacer and the first mask layer, removing portions of the sidewall spacer extending beyond the second mask layer to define a hard mask comprised of a portion of the sidewall spacer, and patterning the gate electrode layer using the hard mask to define a gate electrode of the semiconductor device.

BRIEF DESCRIPTION OF THE DRAWINGS

The invention may be understood by reference to the following description taken in conjunction with the accompanying drawings, in which like reference numerals identify like elements, and in which.

Figure 1A:
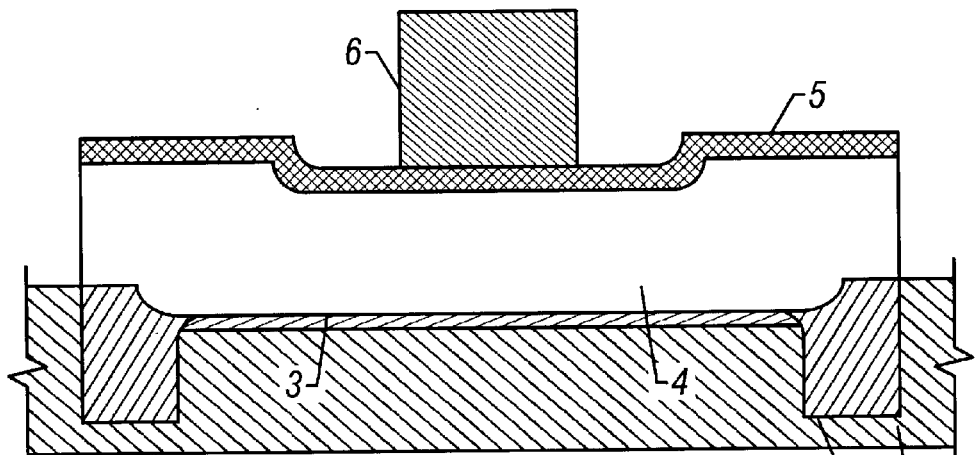
FIGS. 1A–1C depict schematic cross-sectional views of an example of a prior art processing for manufacturing a MOS transistor.
Figure 1B:
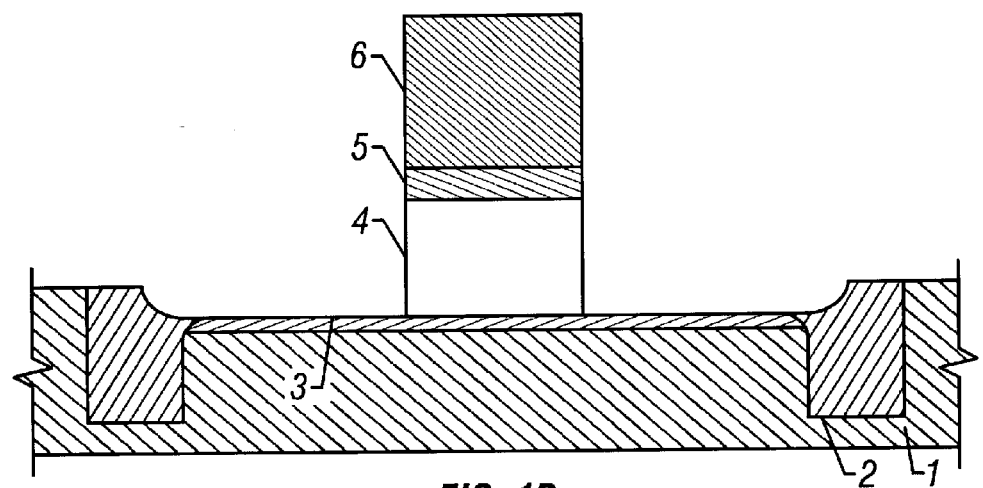
Figure 1C:
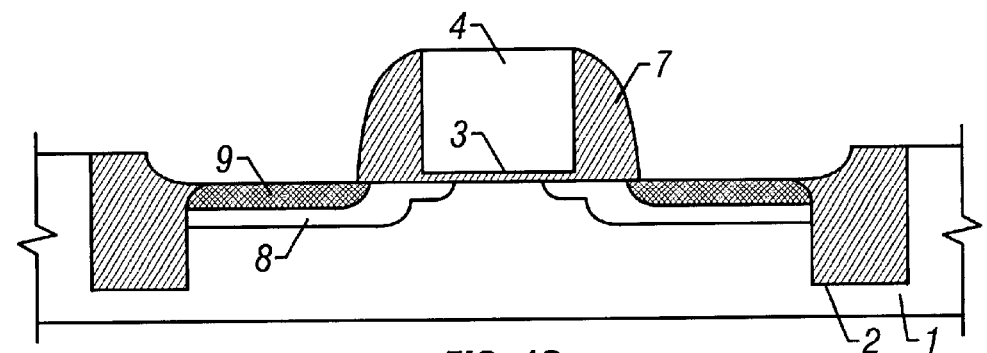

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2A–2I. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming a gate structure of a tansistor. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. Although the present invention is demonstrated with reference to a MOS transistor formed in a silicon substrate, the present invention may be applied to any kind of semiconductor in which a narrow gate structure is required. For example, the semiconductor substrate can be any appropriate material such as germanium, GaAs or other composed semiconductor structures.

As already mentioned, it should be noted that although the various regions and structures of a semi-conductor device are depicted in the drawings as having very precise, sharp configurations and profiles, those skilled in the art recognize that, in reality, these regions and structures are not as precise as is indicated by the drawings. Additionally, the relative sizes of the various features depicted in the drawings may be exaggerated or reduced as compared to the size of those feature sizes on fabricated devices. Nevertheless, the attached drawings are included to describe and explain an illustrative example of the present invention.

Figure 2A:
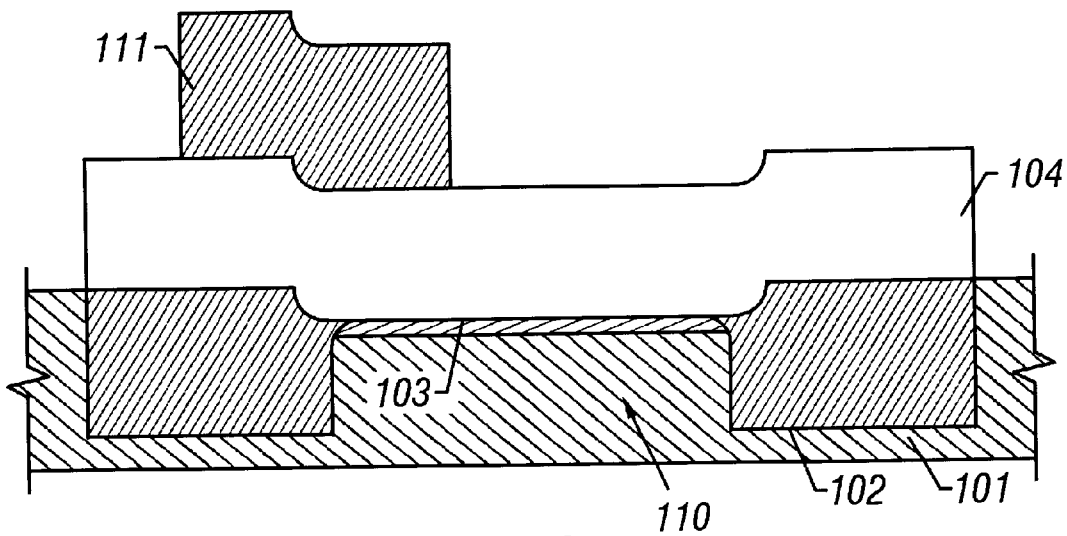
FIGS. 2A–2I show schematic cross-sectional views of various stages of the formation of a semiconductor device according to one embodiment of the present invention.

FIGS. 2A–2I show schematic cross-sectional views of an illustrative transistor during various procedural steps of the fabrication method according to one embodiment of the present invention. In FIG. 2A, a silicon substrate 101 is provided in which shallow trench isolations 102 substantially consisting of, for example, silicon dioxide, define a device-active region 110 within the substrate 101. On the device-active region 110, a thin gate dielectric layer 103 is formed. In one illustrative embodiment, the gate dielectric layer 103 is comprised of a thermally grown layer of silicon dioxide. It is to be noted that the gate dielectric layer 103 may be formed from a variety of materials, e.g., any appropriate insulating layer, such as a nitride layer, may be employed. The device active region 110 is defined as the extension of the substrate region parallel to the surface and underneath the gate dielectric layer 103 shown in FIG. 2A.

Next, a layer of gate electrode material 104, for example, polycrystalline silicon, is formed above the gate dielectric layer 103. In one illustrative embodiment, the gate electrode layer 104 may be comprised of approximately 1000–3000 Å of polysilicon that is formed by a deposition process. Of course, as technological advances continue to occur, the gate electrode 104 may be made even thinner.

Thereafter, a sacrificial layer 111 is formed over the gate electrode material 104 and patterned by standard photolithography and subsequent etching techniques to define a first mask layer with sidewalls 140 over the gate electrode 104. The sacrificial layer 111 may be formed by a variety of techniques using a variety of materials. For example, the sacrificial layer 111 may be comprised of silicon dioxide, or a fluorinated oxide, etc., and it may be formed by a deposition process, such as an LPCVD or PECVD process. Since the feature sizes of the patterned sacrificial layer 111 are in the order of a micrometer, the patterning of the sacrificial layer 111 may be conveniently performed by standard process technology without the necessity of DUV technology. Of course, DUV technology may be employed if desired. It should be noted that the position of the patterned sacrificial layer 111 with respect to the length dimension 130 of the device-active region 110 may be varied as desired.

Figure 2B:
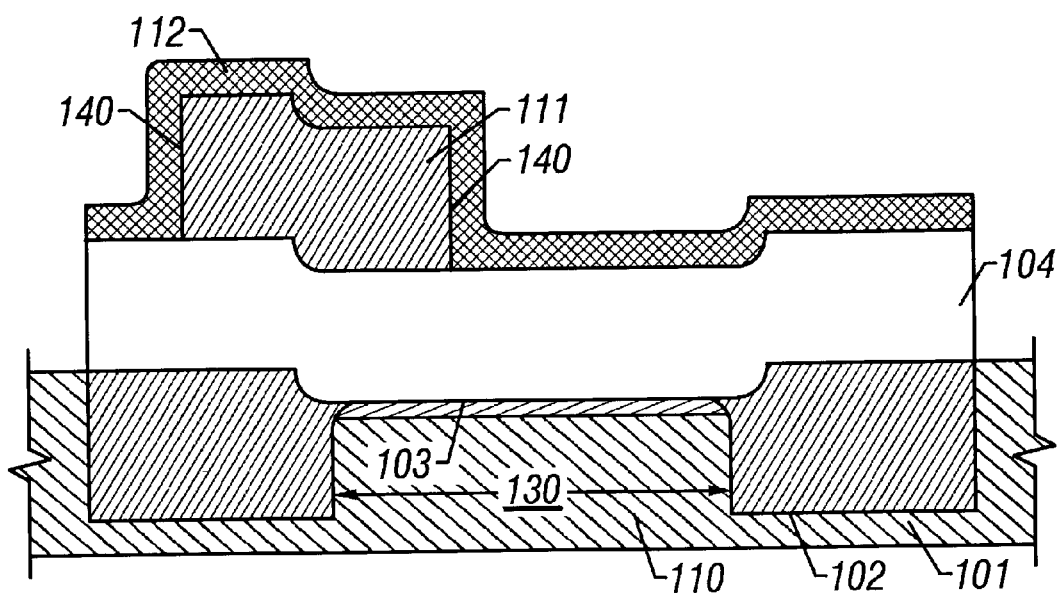

FIG. 2B shows a schematic cross-section of the structure shown in FIG. 2A, wherein a mask layer 112 is formed over the structure. The mask layer 112 may be formed by a variety of techniques and may be made from a variety of materials. For example, the mask layer 112 may be comprised of silicon nitride, silicon oxynitride, or any other material that is selectively etchable with respect to polysilicon, and it may have a thickness ranging from approximately 250–5000 Å. In one illustrative embodiment, the mask layer 112 is comprised of a deposited layer of silicon nitride formed by a chemical vapor deposition process. As will be described more fully below, the thickness of the mask layer 112 can be controlled very precisely and a portion of the mask layer 112 will be used to define a gate length of a gate electrode 104A (see FIGS. 2H–2I).

Figure 2C:
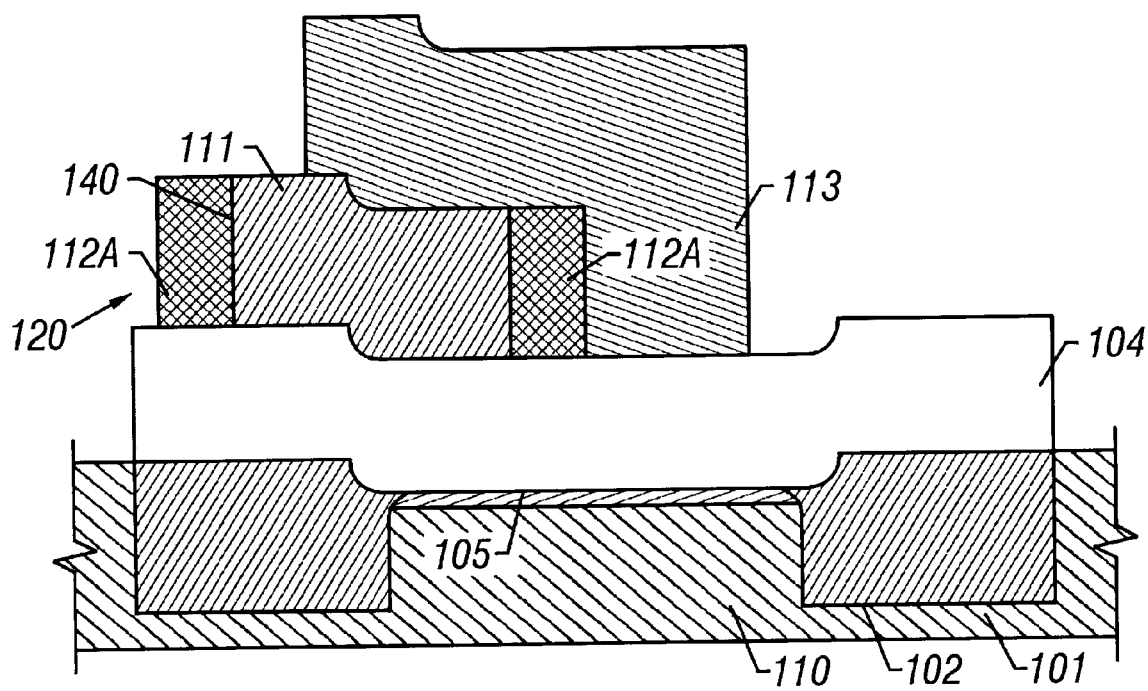

Thereafter, as shown in FIG. 2C, the mask layer 112 has been anisotropically etched to yield a substantially vertical sidewall spacer 112A that extends along the sidewalls 140 of the sacrificial layer 111. The thickness of the sidewall spacer 112A is determined by the thickness of the initially deposited mask layer 112, and hence, excellent thickness control may be obtained. Next, a second mask layer 113 is formed over a portion of the sidewall spacer 112A and a portion of the sacrificial layer 111 such that a portion 120 of the sidewall spacer 112A extends beyond the second mask layer 113 and is exposed to further processing operations. The second mask layer 113 may be formed of photoresist, or other appropriate materials, using standard photolithography and etching techniques.

Figure 2D:
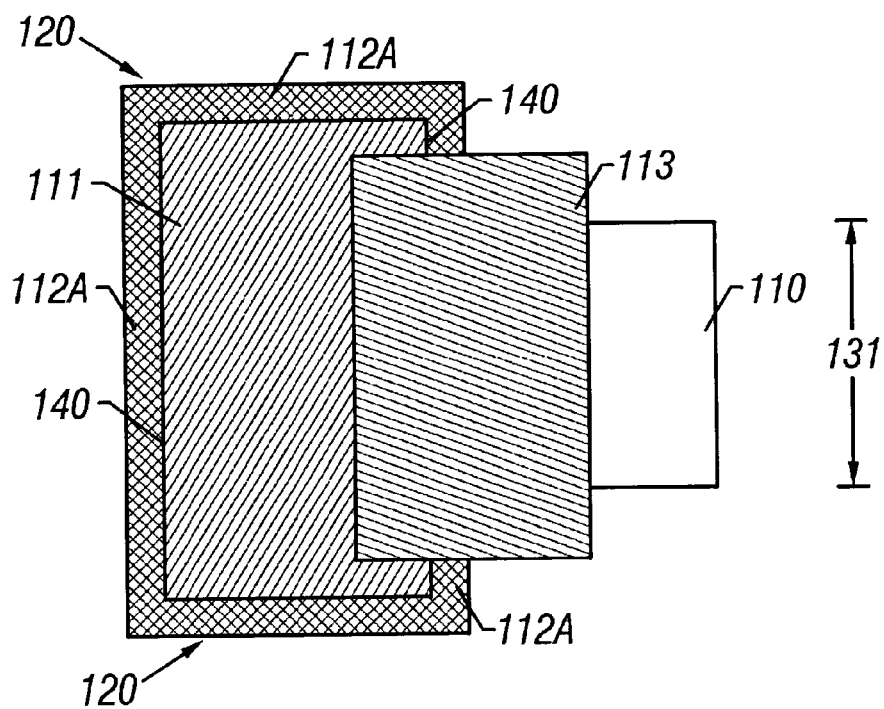

FIG. 2D shows a schematic top view of the structure shown in FIG. 2C. As can be recognized in FIG. 2D, the second mask layer 113 covers a portion of the sidewall spacer 112A which extends along and beyond the width dimension 131 of the device-active region 110. Accordingly, only the undesired, exposed portion 120 of the sidewall spacer 112A extending beyond the second mask layer 113 is exposed for a subsequent removal by an etching process, such as an anisotropic or isotropic etching process.

Figure 2E:
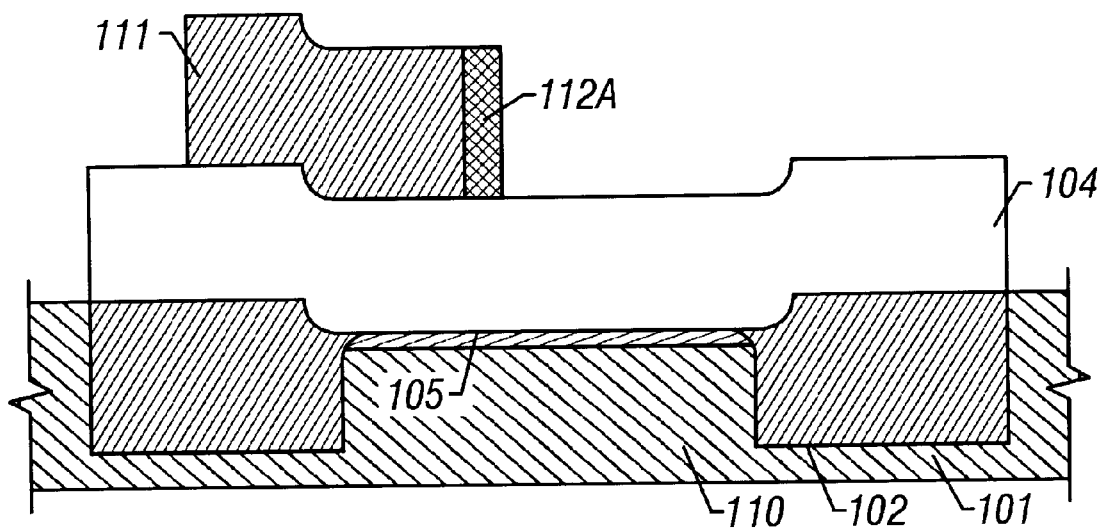

FIG. 2E shows a schematic cross-section of the structure given in FIG. 2D after the undesired, exposed portion 120 of the sidewall spacer 112A and the second mask layer 113 are removed by, for example, one or more isotropic etching processes. Accordingly, the remaining portion of the sidewall spacer 112A, which was previously covered by the second mask layer 113, is maintained and extends along the width dimension 131 of the device-active region 110.

Figure 2F:
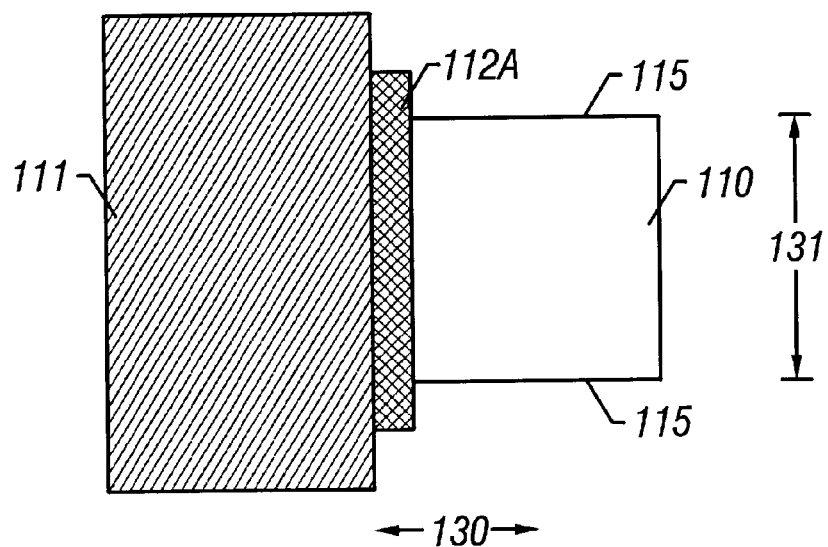

In FIG. 2F, the situation as illustrated in FIG. 2E is depicted in a schematic top view. The remaining portion of the sidewall spacer 112A extends along and beyond the ends 115 of the device-active region 110. Moreover, the lateral extension or thickness of the sidewall spacer 112A, i.e., the extension along the length dimension 130 of the device-active region 110, which will define the gate length of the transistor, is determined by the initially eposited thickness of the mask layer 112. Accordingly, excellent control of the lateral extension or thickness of the sidewall spacer 112A beyond the 100 nm range may be obtained. As described more fully below, this excellent thickness control may allow for more precisely defining what will ultimately become the gate electrode of a semiconductor device.

Figure 2G:
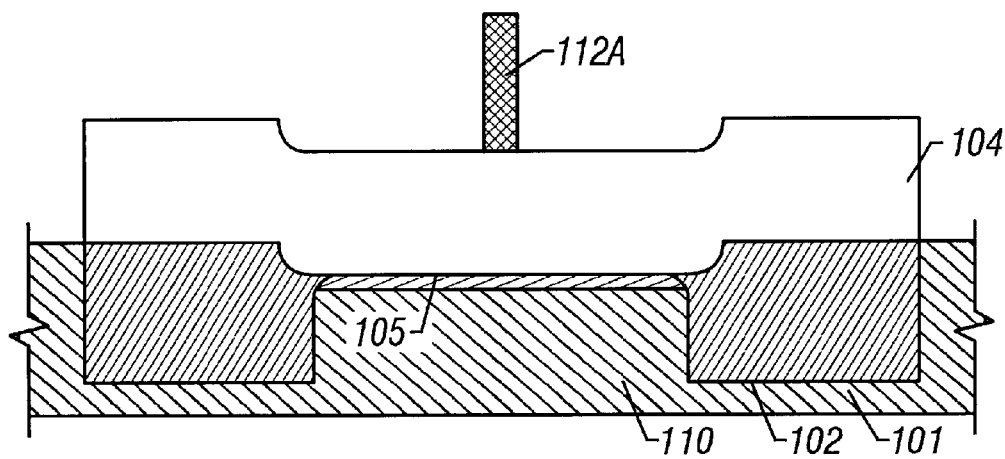

In FIG. 2G, the sacrificial layer 111 shown in the preceding figures has been removed by, for example, an isotropic etching step which substantially affects only the sacrificial layer 111, but not the illustrative silicon nitride sidewall spacer 112A and the polysilicon gate electrode material 104. Thus, the sidewall spacer 112A is left and can serve as a hard mask 112A for the subsequent gate electrode patterning. As the lateral extension or thickness of the hard mask 112A approximately determines the gate length of the device, the process according to the present invention can easily be adjusted to yield extremely narrow gate structures.

Figure 2H:
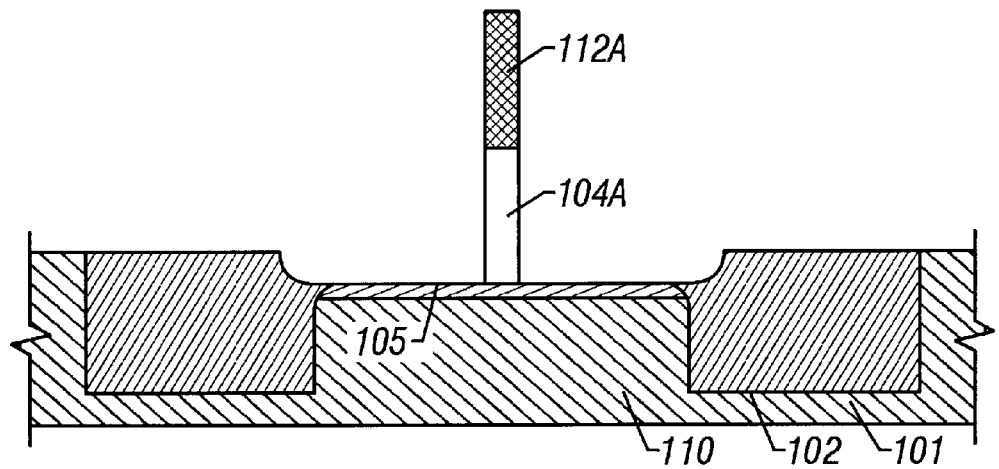

FIG. 2H shows a schematic cross-section of the structure given in FIG. 2g after the gate electrode material 104 has been partially removed by, for example, an anisotropic etching process, to form a gate electrode 104A. The hard mask 112A may then be removed by a selective wet chemical etching step. It is to be noted that the patterning of the gate electrode of the illustrative transistor device disclosed herein to define a device having an extremely short gate length may not require any advanced photolithographic or etch processes.

Figure 2I:
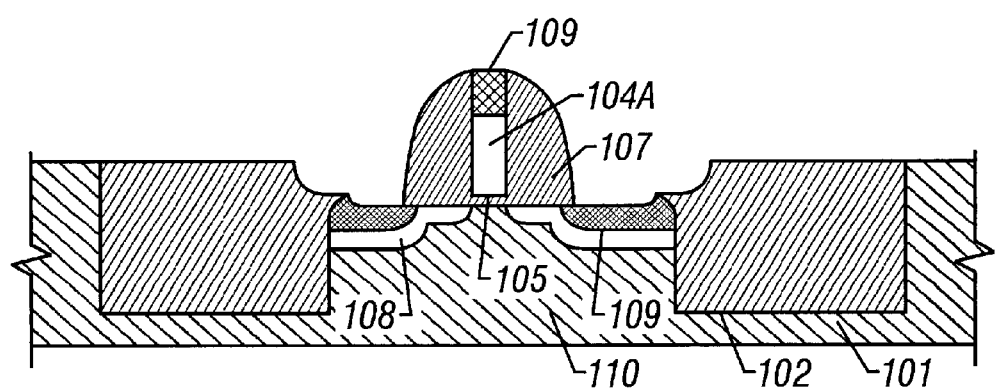

FIG. 2I shows a schematic cross-section of the device after it has been completed by conventional CMOS processing. In FIG. 2I, drain and source regions 108 are formed and silicide contacts 109 are formed on the drain, source and gate electrodes. Furthermore, additional sidewall spacers 107 adjacent to the gate electrode 104A are shown. Since the procedural steps which lead to a structure as shown in FIG. 2I are well known to those skilled in the art, a description thereof is omitted.

As previously stated, the method of the present invention is not limited to CMOS processing in silicon substrates, but may also be employed for any appropriate semiconductor substrate such as Ge, GaAs or other III–V or II–VI semiconductors. Furthermore, any appropriate material may be employed as gate electrode material and the sacrificial layer may be formed of materials other than silicon dioxide ($SiO_2$). In the example described in the specification, the mask layer 112 is comprised of silicon nitride, but any appropriate material may be selected in accordance with design requirements. Additionally, the present invention allows the formation of gate structures having a gate length from the $\mu$m range to the sub-100 nm range. It is important to note, that the method of the present invention may be easily implemented into conventional process lines even if they do not represent the most recent technological standard.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing a semiconductor device, comprising:

providing a semiconductor substrate;

forming a gate dielectric layer over a device active region, the device active region having a width dimension and a length dimension;

depositing a layer of gate electrode material on the gate dielectric layer;

depositing a sacrificial layer over the layer of gate electrode material;

patterning the sacrificial layer by photolithography and etching such that an edge of the patterned sacrificial layer extends along the width dimension of the device active region, said patterned sacrificial layer comprised of a plurality of sidewalls and wherein dimensions of the patterned sacrificial layer are higher than a radiation wavelength used for the photolithography;

depositing a mask layer having a first thickness over the device active region and the patterned sacrificial layer, wherein the first thickness is less than the radiation wavelength;

anisotropically etching the mask layer to form sidewall spacers on the side walls of the patterned sacrificial layer;

selectively removing portions of the sidewall spacers to define a hard mask comprised of a portion of the sidewall spacers extending along the width dimension of the active area of the device; and anisotropically etching the gate electrode material using the hard mask to form a gate electrode having a length dimension less than the radiation wavelength and wherein the gate length is determined by the first thickness of said mask layer.

2. The method of claim 1, wherein selectively removing portions of the sidewall spacers to define a hard mask comprised of a portion of the sidewall spacers extending along the width dimension of the active area of the device comprises:

forming an etch mask pattern covering portions of the sidewall spacers formed on the edge of the patterned sacrificial layer that extends along the width dimension;

performing an etch process to remove portions of the sidewall spacers not covered by the etch mask pattern; and removing the etch mask pattern.

3. The method of claim 1, wherein the mask layer is deposited by a chemical vapor deposition process.

4. The method of claim 1, wherein the sacrificial layer is patterned by a standard photolithographic process and an etching step.

5. The method of claim 2, wherein the etch mask pattern is formed of photo-resist by a standard photolithographical process.

6. The method of claim 2, wherein removing portions of the sidewall spacers not covered by the etch mask pattern is comprised of an isotropic etching process.

7. The method of claim 1, further comprising the step of removing the hard mask by selective wet-etching after etching the gate electrode material.

8. The method of claim 1, further comprising the steps of:

forming lightly doped drain and source regions, respectively;

forming side wall spacers adjacent and in contact to the side walls of the gate electrode;

forming a highly doped drain and source, respectively, in the lightly doped drain and source regions; and forming low resistance areas on the drain, the source and the gate electrode, respectively.

9. The method of claim 1, wherein the semiconductor comprises silicon.

10. The method of claim 1, wherein the gate electrode material is polycrystalline silicon.

11. The method of claim 1, wherein the sacrificial layer comprises silicon dioxide.

12. The method of claim 1, wherein the mask layer comprises nitrogen and silicon.

13. The method of claim 1, wherein the gate length is less than 0.5 $\mu$m.

14. The method of claim 1, wherein the gate length is less than 0.25 $\mu$m.

15. The method of claim 1, wherein the gate length is less than 0.15 $\mu$m.

16. The method of claim 1, wherein the gate dielectric layer comprises silicon dioxide.

17. A method of forming a gate electrode in a transistor, comprising:

providing a silicon substrate;

defining a device active region in the substrate by forming electrically inactive boundaries, the device active region having a width dimension and a length dimension;

forming a gate oxide layer over the device active region;

depositing a layer of polycrystalline silicon on the gate oxide layer;

blanket-depositing a sacrificial oxide layer over the polycrystalline silicon layer;

patterning the sacrificial oxide layer by photolithography and etching such that an edge of the patterned sacrificial oxide layer extends along the width dimension of the device active region, wherein dimensions of the patterned sacrificial oxide layer are higher than a radiation wavelength used for the photolithography;

depositing a silicon nitride mask layer having a first thickness over the device active region and the patterned sacrificial oxide layer by chemical vapor deposition, wherein the first thickness is less than the radiation wavelength;

anisotropically etching the silicon nitride mask layer for forming substantially vertical side wall spacers on the side walls of the patterned sacrificial oxide layer;

forming a photo-resist mask partially covering a portion of the patterned sacrificial oxide layer, and covering at least a portion of the side wall spacer formed on said edge extending along the width dimension of the device active region;

etching a portion of the side wall spacers not covered by the photoresist mask to define a hard mask comprised of a portion of the sidewall spacer;

removing the photoresist mask pattern;

anisotropically etching the polycrystalline silicon layer by using the hard mask to form the gate electrode;

wherein a gate length in a direction of the length dimension is less than the radiation wavelength and wherein the gate length is determined by the first thickness.

* * * * *